(12) United States Patent
Gorman et al.

(10) Patent No.: US 6,882,583 B2
(45) Date of Patent: Apr. 19, 2005

(54) METHOD AND APPARATUS FOR IMPLEMENTING DRAM REDUNDANCY FUSE LATCHES USING SRAM

(75) Inventors: Kevin W. Gorman, Milton, VT (US); Dale E. Pontius, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/249,682

(22) Filed: Apr. 30, 2003

(65) Prior Publication Data

US 2004/0218454 A1 Nov. 4, 2004

(51) Int. Cl.[7] ............................ G11C 29/00; G11C 7/00
(52) U.S. Cl. .................................... 365/200; 365/225.7
(58) Field of Search ............................... 365/200, 225.7

(56) References Cited

U.S. PATENT DOCUMENTS

| | | | |
|---|---|---|---|
| 5,446,864 A | 8/1995 | Burghardt et al. | |
| 5,455,937 A | 10/1995 | Berman et al. | |
| 5,677,917 A | 10/1997 | Wheelus et al. | |
| 5,859,801 A | * 1/1999 | Poechmueller | 365/225.7 |
| 5,961,653 A | 10/1999 | Kalter et al. | |
| 5,970,000 A | 10/1999 | Kirihata et al. | |
| 6,081,463 A | 6/2000 | Shaffer et al. | |
| 6,144,591 A | 11/2000 | Vlasenko et al. | |
| 6,286,118 B1 | 9/2001 | Churchill et al. | |
| 6,556,490 B1 | * 4/2003 | Shubat et al. | 365/200 |
| 6,603,690 B1 | * 8/2003 | Chen et al. | 365/200 |

OTHER PUBLICATIONS

"Fuse Book Offering Redundancy Test Immediately", IBM Technical Disclosure Bulletin, vol. 37, No. 03, Mar. 1994, pp. 283–286.

* cited by examiner

Primary Examiner—Trong Phan
(74) Attorney, Agent, or Firm—McGinn & Gibb, PLLC; Robert A. Walsh, Esq.

(57) ABSTRACT

A method and structure is disclosed for serially storing and retrieving fuse information to and from a non-scannable static random access memory (SRAM) array within an embedded DRAM structure. The SRAM array is part of a scan chain and is connected to upstream and downstream latches that make up the scan chain. Various data is serially scanned into the scan chain. As the data flows through the entire scan chain, the invention counts the number of bits scanned into the embedded DRAM structure using a counter. The counter can be included within the embedded DRAM structure. After the counter counts to an amount equal to the number of bits of storage of all downstream scan latches in the scan chain, the invention loads the fuse information into a shift register. When the shift register is full, the invention loads the contents of the shift register to a SRAM line. The lengths of the shift register and the SRAM line are equal to a fuse word. The invention repeats these processes of loading the shift register and loading the SRAM array until the SRAM array is full. The fuse information is read from the SRAM array by simply specifying an address in the SRAM array.

34 Claims, 7 Drawing Sheets

METHOD AND APPARATUS FOR IMPLEMENTING DRAM REDUNDANCY FUSE LATCHES USING SRAM

BACKGROUND OF THE INVENTION

1. Field of the Invention

The present invention generally relates to the storing of fuse information and more particularly, to a structure and method for serially storing and retrieving fuse information to and from a non-scannable static random access memory (SRAM) array within an embedded DRAM structure.

2. Description of the Related Art

Dynamic random access memory (DRAM) arrays used in embedded applications depend on information (typically redundancy information) stored in fuses. This information must be loaded into fuse latches in the embedded DRAM macro on power up, before normal operations can begin. This information is traditionally loaded in a serial manner using scan paths connected between the fuse latches. In some applications a centralized location for fuse information (redundancy information) is useful or a reduced area dedicated to fuse information is desired.

However, the scan latches used to hold such information consume a large amount of space within the DRAM structure. The invention described below avoids having to use scan latches to maintain fuse information, which produces substantial space saving when compared to conventional structures. In addition, the invention described below operates at a higher speed than conventional non-localized scan latch based devices.

SUMMARY OF THE INVENTION

The present invention provides a structure and method for serially storing and retrieving fuse information to and from a non-scannable static random access memory (SRAM) array within an embedded DRAM structure. The SRAM array is part of a scan chain and is connected to upstream and downstream latches that make up the scan chain. Various data is serially scanned into the scan chain. As the data flows through the entire scan chain, the invention counts the number of bits scanned into the embedded DRAM structure using a counter. The counter can be included within the embedded DRAM structure. After the counter counts to an amount equal to the number of bits of storage of all downstream scan latches in the scan chain, the invention loads the fuse information into a shift register. When the shift register is full, the invention loads the contents of the shift register to a SRAM line. The lengths of the shift register and the SRAM line are equal to a fuse word. The invention repeats these processes of loading the shift register and loading the SRAM array until the SRAM array is full. The fuse information is read from the SRAM array by simply specifying an address in the SRAM array.

The fuse information comprises a listing of activated fuses (those fuses that have been blown in order to replace defective devices with properly operating devices within the DRAM array). The shift register is utilized to collect the data that is received serially and then load multiple bits in parallel to the SRAM (because data is preferably written to the SRAM array in parallel operations and not serially). The process of loading the contents of the shift register to the SRAM line comprises counting, possibly in a second counter, bits loaded into the shift register. Once the value in the second counter is equal to the size of the SRAM line, all of the bits from the shift register are simultaneously loaded into the SRAM line in parallel.

Another embodiment of the invention that is useful when the downstream length of the scan chain is unknown utilizes a FIFO operation. This embodiment continuously stores the data in the SRAM array using the first-in, first-out (FIFO) operation until no more data is scanned into the scan chain. More specifically, the FIFO operation writes a first bit to a first address of the SRAM array and increments an address counter as each bit in written to the SRAM array. The FIFO operation continues to write additional bits to additional addresses of the SRAM array until the address counter reaches a maximum size of the SRAM array. Once the SRAM array is full, the invention reads and outputs the first bit that was written in the array to the downstream latches. The invention then overwrites the first bit with the most recently received bit. These processes of outputting and overwriting are repeated for each subsequent bit in the SRAM array as additional bits are received.

Therefore, this embodiment writes the serially received data to each individual address within the SRAM array as it is received along the scan chain. After the SRAM array becomes full, the process overrides the oldest bit (the first written bit) with the most recently received bit of data. This overriding process ensures that, once data stops being input into the scan chain, the SRAM array maintains only the last section of the data input into the scan chain.

The forgoing embodiment may produce a situation where a fuse word is divided between two lines in the SRAM array. Therefore, the next two features of the invention provide retrieving and realigning processes that accommodate one fuse line being divided between two lines in the SRAM array. In each situation, the length of SRAM lines in the SRAM array are equal to a fuse word.

The retrieving process first calculates an offset by reading the final value from the address count register (which maintained a counter that counted to the maximum number of bits in the SRAM, then reset, and began counting again from zero). The data immediately following the value of the offset counter represents the oldest bits received while the data at and immediately preceding the offset counter represents the data most recently received. The oldest bit of data represents the first bit of fuse information. Therefore, when a request is made for the address of a bit of fuse information, the offset must be added to the address in order to locate the physical address of that bit.

This embodiment reads two SRAM lines in a single read. More specifically, the invention reads the SRAM line containing the physical address and the immediately succeeding (following) line. Thus, the invention reads a "first" SRAM line and a following "second" SRAM line within a single system clock read cycle because the invention anticipates that the fuse word may have wrapped between the two lines. The invention calculates whether and how the fuse word wraps between the two lines by dividing the physical address by the SRAM line length. The division process produces a whole number and a remainder. The remainder indicates the bit (between the most significant bit and the least significant bit) within the first SRAM line where the physical address is located.

The invention combines the end of the first SRAM line with the beginning of the second SRAM line to output a single fuse word. The end of the first SRAM line comprises the bits of the first SRAM line from the physical address to the least significant bit of the first SRAM line. The beginning of the second SRAM line comprises the bits of the second SRAM line from the most significant bit of the second SRAM line up to one significant bit position less than the significant bit position of the physical address in the first SRAM line (as determined by subtracting one from the remainder value discussed above).

Alternatively, immediately after reading all the fuse information to the SRAM array, the invention can take a few clock cycles to realign the SRAM array so that all fuse words appear within a single a SRAM line and are thereby "aligned" with the SRAM lines. This aspect of the invention is similar to the previous process and begins by calculating the offset as described above. This aspect of the invention then reads the two SRAM lines (e.g., reads a "first" SRAM line and an adjacent "second" SRAM line). The invention stores bits from the end of the first SRAM line in a first data register. This process then combines the end of the first SRAM line with the beginning of the second SRAM line to create a single fuse word and stores (overwrites) the single fuse word in an address where the first SRAM line was read from during the reading process. This process is repeated for each subsequent line in the SRAM array, thereby insuring that each line in the SRAM array contains a single fuse word.

The invention also includes embodiments that utilize multiple SRAM arrays within each embedded DRAM structure. In such embodiments, the SRAM arrays are connected to upstream and downstream latches that make up the scan chain. In a somewhat similar process as that described above, this aspect of the invention serially scans data into the scan chain and stores the data in the SRAM arrays using a first-in, first-out (FIFO) operation. This FIFO operation is somewhat different than the previously described FIFO operation in that this process first writes to a line of the first SRAM array and, once the line of the first SRAM array is full, writes additional bits received to the same line of the second SRAM array. The FIFO operation writes to a subsequent line in the first SRAM array only after the previous line of the second SRAM array is full.

In this situation, a fuse word may be split between adjacent lines of the separate SRAM arrays. Therefore, the process of retrieving the fuse information accommodates for this potential situation. Once again, the length of SRAM lines in the SRAM arrays are equal to a fuse word and this process begins by calculating the offset between the fuse words and the SRAM lines by maintaining an offset counter that counts to twice a fuse word size and then resets. Again, the value remaining in the offset counter at the end of writing to the SRAM represents the offset.

The invention reads one SRAM line from each of the SRAM arrays in a single read cycle. Thus, the invention reads a "first" SRAM line from one of the arrays and a following "second" SRAM line from the other array within the single read cycle. This can include reading a line from the first SRAM array followed by reading the same line from the second and SRAM array. Alternatively, this reading process can read one line from the second SRAM array followed by reading a subsequent line in the first SRAM array. The invention then combines the end of the first SRAM line with the beginning of the second SRAM line to output a single fuse word in a similar manner to that discussed above.

The invention produces a number of advantages when compared to conventional embedded DRAM structures. The invention enables the conversion of non-scannable memory elements which previously could only be loaded in parallel into scannable memory elements that can be loaded in a serial fashion. This conversion allows the use of previously non-scannable memory elements in environments that require a serial method for loading/unloading the memory elements. The non-scannable memory elements typically have great density and speed advantages over scannable memory elements, and the invention enables these advantages in embedded DRAM structures, especially the fuse information storage registers that were previously limited to being implemented using larger and slower scannable elements in the past due to the serial load requirements.

BRIEF DESCRIPTION OF THE DRAWINGS

The invention will be better understood from the following detailed description of preferred embodiment of the invention with reference to the drawings, in which.

DETAILED DESCRIPTION OF THE PREFERRED EMBODIMENT OF THE INVENTION

As mentioned previously, fuse information is traditionally loaded in a serial manner using scan paths connected between the fuse latches. In some applications a centralized location for fuse information latches is useful (redundancy information) or a reduced area dedicated to fuse information is desired. Instead of using scan latches, the invention stores the fuse information in SRAM.

One embodiment discussed herein is useful with stand alone DRAM. In this embodiment, a shift register accumulates fuse information until full, and then loads it into the SRAM. Fuse information loading starts and stops with the information for only that DRAM. However, the situation is different for DRAMs that are embedded within a scan chain. In such a situation, the fuse information serially flows down the scan chain before or after information intended for upstream and downstream devices/latches within the scan chain. Therefore, for DRAMs used in embedded applications, a problem arises because fuse information loading typically extends across multiple DRAM macros and various other macros that use fuse information. In order to successfully load an SRAM with the correct fuse information for a particular DRAM macro, several issues must be addressed.

First, the SRAM and its interface should resemble a series of discrete latches connected in a fuse scan chain to maintain compatibility with all subsequent fuse latches. This allows for all scan information to enter (and pass through) a virtual scan chain equal in length to the number of bits in the SRAM. If this fails, all latches after the SRAM in the fuse scan chain will not be loaded with the proper information.

Second, the information stored in the SRAM should be accessible within a single clock cycle (where clock cycle is defined as that used by the related logic that accesses and interprets the fuse information) in order to provide some similarity to reading the fuse information from discrete latches. The information access should be independent of the actual physical location of the fuse information in the SRAM.

The methods outlined below address these problems and provide a means of using an SRAM for fuse information storage in a reduced space in a centralized location. The final circuitry of the SRAM plus interface logic can be loaded and addressed like a register array while providing significant area savings. The different embodiments of the invention described below all satisfy the two requirements discussed above. More specifically, during fuse loading, the SRAM acts as a virtual scan chain of discrete latches, and the fuse information can be accessed from the SRAM within one system clock cycle without knowledge of its actual physical location within the SRAM.

Figure 1:
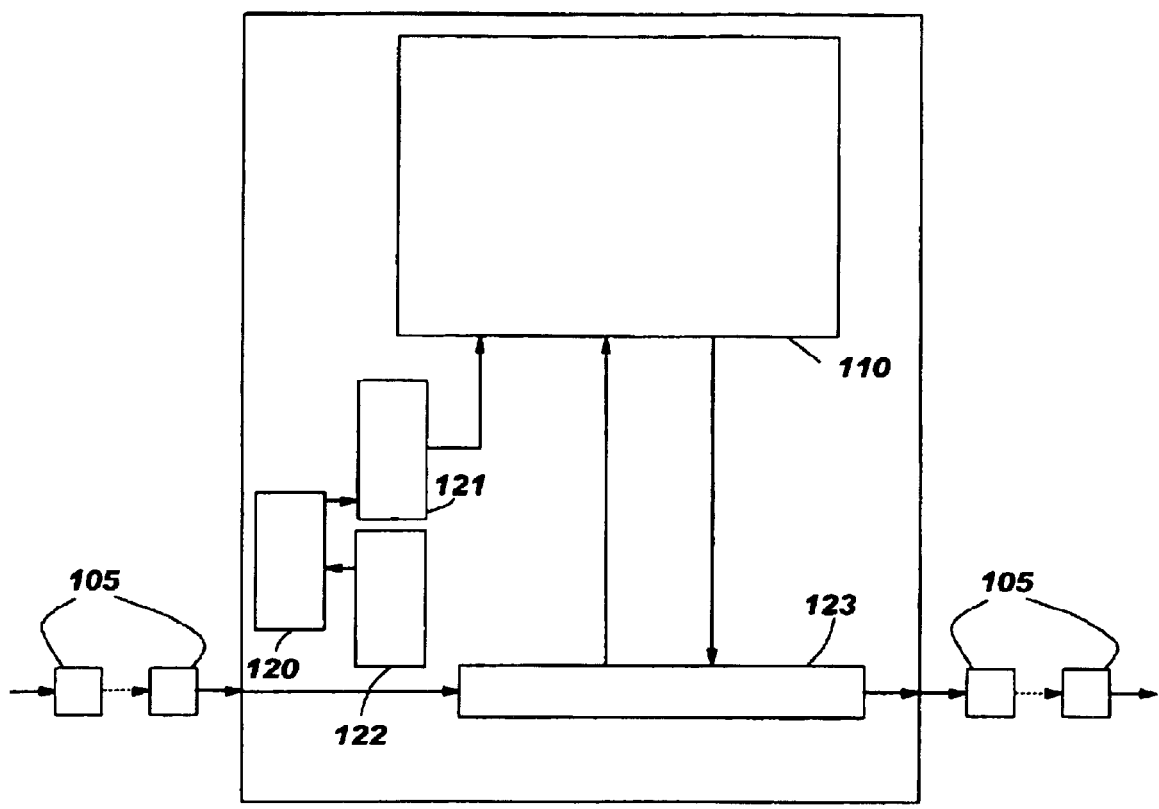
FIG. 1 is a schematic diagram of a one embodiment of the inventive embedded DRAM structure that includes fuse information within an SRAM.

The first embodiment shown in FIG. 1 represents the simplest scheme to implement and requires that the circuit be provided with information as to the number of bits in the fuse latch chain 105 that are subsequent to the SRAM array 110 in question. A programmable SRAM load start counter 122 counts to this number of bits. After this time, all of the subsequent (downstream) bits have passed through, and a shift register 123 equal in width to the SRAM 110 word-width will be loaded. When the shift register 123 is full it will be loaded into the current address, thus ensuring a fuse word of information per SRAM 110 word-line. The start counter 122 is programmed to the total number of subsequent (downstream) bits. An address counter 121, and a bit counter 120 are used to cause the shift register 123 to be written to the SRAM 110 upon its carry, as shown in FIG. 1. Accessing fuse information from the SRAM 110 is then simply a matter of providing the correct address and waiting for the read information to be outputted.

Figure 2:
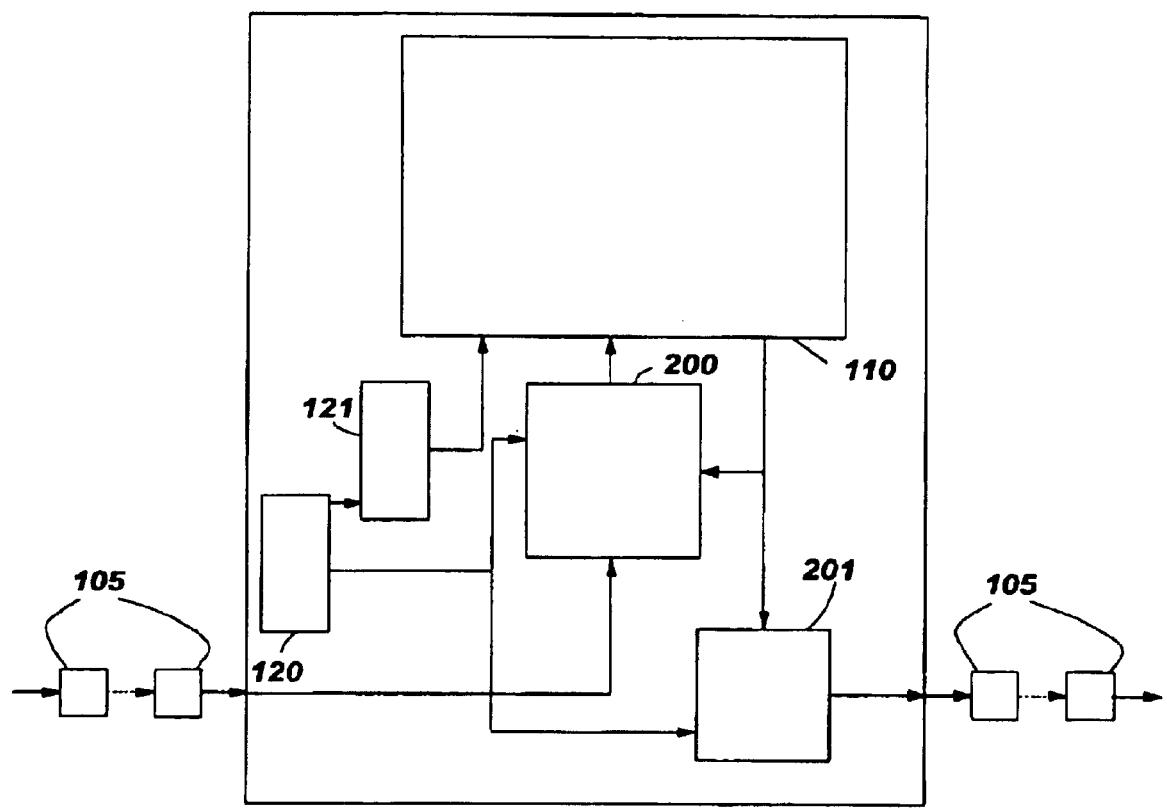
FIG. 2 is a schematic diagram of a one embodiment of the inventive embedded DRAM structure that includes fuse information within an SRAM.

Another embodiment of the invention that is useful when the downstream length of the scan chain is unknown utilizes a first-in, first-out (FIFO) operation and is shown in FIG. 2. This embodiment continuously stores the data in the SRAM array using the FIFO operation until no more data is scanned into the scan chain. No knowledge of the subsequent fuse latch scan chains is needed with this embodiment. The interface logic to the SRAM 110 creates a virtual register array for loading and information access.

The address counter 121 continually increments through the SRAM 110 row space, while a bit counter 200 continually increments through the SRAM 110 word width. On each fuse scan clock cycle, the current data at the current address is read from the SRAM 110 on the first half of the clock cycle, and is then written back during the second half of the fuse scan clock cycle with the newest bit of scan information inserted at the location indicated by the bit counter. The previous bit at this position is sent out as the scan output 201 of the SRAM 110 fuse block.

Thus, the FIFO operation writes a first bit to the very first address of the SRAM array 110 and increments the address counter 121 as each bit is detected by the bit counter 120. The FIFO operation continues to write additional bits to additional addresses of the SRAM array 110 until the address counter 121 reaches a maximum size of the number of bits in the SRAM array 110. Once the SRAM array 110 is full, the invention reads and outputs the first bit that was written in the array (the oldest bit) to the downstream latches 105 using the scan output 201. This is referred to as the scan out bit selection logic. The invention then overwrites the first bit with the most recently received bit. This referred to as the scan and bit insertion logic. These processes of outputting and overwriting are repeated for each subsequent bit in the SRAM array as additional bits are received. Each time this process reaches the end of the SRAM array, it returns to the beginning and restarts.

Therefore, this embodiment writes the serially receive data to each individual address within the SRAM array as it is received along the scan chain. After the SRAM array becomes full, the process overrides the oldest bit (the first written bit) with the most recently received bit of data (the newest bit). This overriding process ensures that, once data stops being input into the scan chain, that the SRAM array maintains only the last section of the data input into the scan chain (the newest data received). This last section of data will be the appropriate data for the given SRAM because upstream latches will maintain (and not forward) the serial data intended for such upstream latches. Thus, the last portion of data received by the SRAM in question will be the fuse information associated with the specific embedded DRAM.

This embodiment allows the subsequent (downstream) scan bits to flow through the SRAM block 110 as if it were composed of individual serialized scan latches. It also guarantees that, at the end of the scan initialization, every necessary bit of fuse information resides in the SRAM 110.

Figure 3:
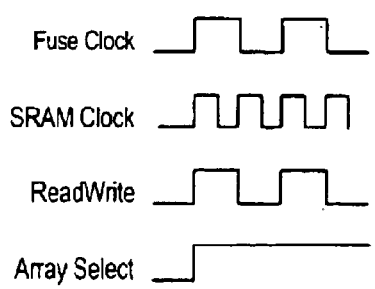
FIG. 3 is a signal timing diagram that illustrates the signals used to store the fuse information in the structure shown in FIG. 2.

FIG. 3 illustrates the timing diagram for the various signals as data is written into the SRAM 110 shown in FIG. 2. The SRAM clock runs at twice the speed of the fuse clock and the read/write clock because the SRAM clock must perform a read and a write during the time when a single read is made by the scan and bit insertion logic input 200. As explained above, the SRAM 110 must read the old bit from the address in question so that it can be output through the scan out bit selection logic output 201 and also write the new bit in the same address in a single fuse clock read/write cycle. The fuse clock and read write clock are synchronized and the array selects signal is always on, indicating that the scan data flow through the SRAM is continuous during the entire scanning operation.

Accessing the SRAM 110 is more complicated because a fuse word that would normally be contained in a single line in the SRAM 110 may be divided between two adjacent SRAM lines depending on the number of subsequent bits in the fuse scan chain. In other words, because it is unlikely that the number of downstream bits is an even multiple of the number of bits in the SRAM 110, the last bit of fuse information is unlikely to end up in the last logically addressed bit of the SRAM 110.

The first approach at reading the misaligned SRAM 110 requires that the SRAM 110 to run at double the clock speed of the system clock (as shown in the timing diagram in FIG. 5) of the accessing logic. This allows the memory to be accessed twice on each system clock read cycle. This is necessary in order to read two adjacent lines from the SRAM in case the fuse word has been divided across two SRAM lines. The final value stored in the address count register 121 (previously used to load the SRAM 110) is now used as the offset value that is added to the normal logical input address to provide the true physical location of the start of the fuse word by the physical address offset device 400.

The fuse information is read from this physical address and stored in a first data register 402 (data register A). The next subsequent SRAM line following the line that was just read is then read and combined with the information from the first data register 402 in the data mapping logic combiner 403. The final value stored in the address count register 121 (previously used to load the SRAM array 110) is used as a bit offset to construct the true fuse word from the two partial lines of SRAM data (the data stored in register A together with the current SRAM output).

Figure 4:
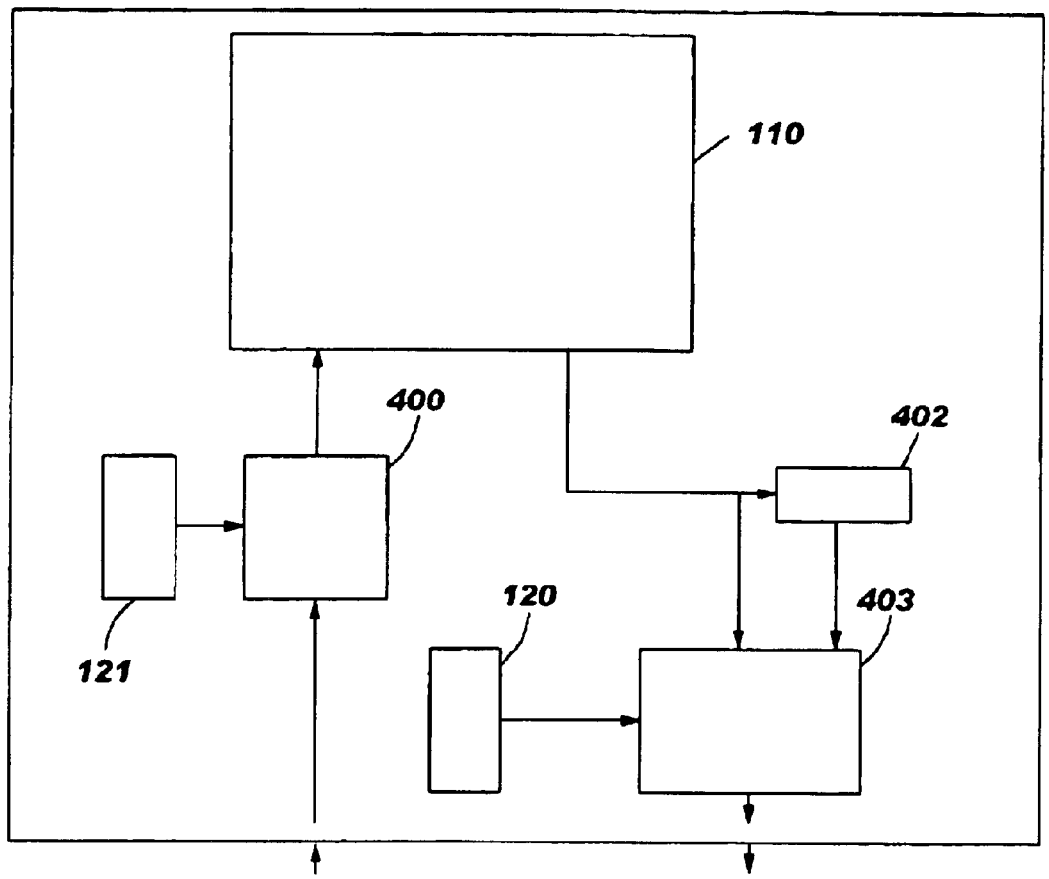
FIG. 4 is a schematic diagram of a one embodiment of the inventive embedded DRAM structure that includes fuse information within an SRAM.

Thus, in the embodiment shown in FIG. 4, the retrieving process first calculates an offset by reading the final value from the address count register 121 (which maintains a counter that counted to the maximum number of bits in the SRAM, then reset, and began counting again from zero). Therefore, the address count register 121 maintains the position of where the newest bit of data was written into the SRAM as the scan data cycled through the SRAM. The value remaining in the address count register 121 at the end of writing to the SRAM represents the offset.

As mentioned above, the number of storage locations (bits) within the SRAM can be different than the number of bits within the fuse data information. Therefore, the words of fuse information may not be perfectly aligned with the lines in the SRAM. Thus, the offset counter may stop in the middle of a central row (line) of the SRAM. The data immediately following the value of the offset counter represents the oldest bits received while the data immediately preceding the offset counter represents the data most recently received. The oldest bit of data represents the first bit of fuse information. Therefore, when a request is made for the address of the first bit of fuse information, the offset must be added to the address in order to locate the physical address.

If the adding of the logical address and the offset produces a result that exceeds the size of the SRAM, this indicates that the physical address of the fuse information is actually located at the beginning of the SRAM array. This occurs because, as explained above, when writing to the SRAM array, each time the end of the SRAM array is reached, the address counter 121 returns to the beginning of the SRAM array to overwrite the old bits as the old bits are output to the downstream scan latches. Therefore, in such a situation, the invention determines the amount by which the calculated physical address exceeds the size of the SRAM array. This excessive amount represents the correct physical address from the very beginning of the SRAM array.

This embodiment reads two SRAM lines in a single read. More specifically, the invention reads the SRAM line containing the physical address and the immediately succeeding (following) line. Thus, the invention reads a "first" SRAM line and a following "second" SRAM line within a single system clock read cycle because the invention anticipates that the fuse word may have wrapped between the two lines. The invention calculates whether and how the fuse word wraps between the two lines by dividing the physical address by the SRAM line length. The division process produces a whole number and a remainder. The whole number represents the row in which the physical address is located. The remainder indicates the bit (between the most significant bit and the least significant bit) within the first SRAM line where the physical address is located (e.g., the column).

The invention combines the end of the first SRAM line with the beginning of the second SRAM line to output a single fuse word. The end of the first SRAM line comprises the bits of the first SRAM line from the physical address to the least significant bit of the first and SRAM line. The beginning of the second SRAM line comprises the bits of the second SRAM line from the most significant bit of the second SRAM line up to one significant bit position less than the significant bit position of the physical address in the first SRAM line (as determined by subtracting one from the remainder value discussed above).

Figure 5:
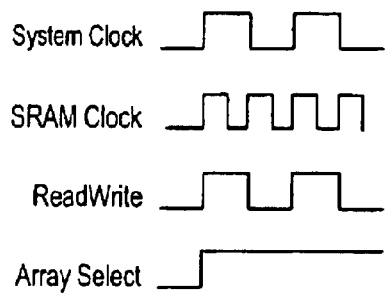
FIG. 5 is a signal timing diagram that illustrates the signals used to retrieve the fuse information in the structure shown in FIG. 4.

FIG. 5 shows the signal timing diagram used to read the fuse information from the SRAM in the method described in the forgoing embodiment. The signals shown in FIG. 5 are similar to those shown in FIG. 3, except that the read write clock is activated and maintained throughout the entire reading of the fuse redundancy information. The SRAM clock runs at twice the speed of the system clock, because the SRAM clock must perform two reads for every system clock driven request for redundancy information. As explained above the SRAM 110 must reconstruct a single fuse word from two SRAM words in some instances.

Alternatively, immediately after reading all the fuse information to the SRAM array, the invention can take a few clock cycles to re-align the SRAM array so that all fuse words appear within a single a SRAM line and are thereby "aligned" with the SRAM lines. By re-aligning the SRAM array, this embodiment avoids having to perform the two line read and alignment (discussed in the previous embodiment) each time a fuse word is accessed. This also eliminates the need to run the SRAM clock at twice the speed of the system clock for a read.

This embodiment provides that, after the fuse information has loaded, a number of clock cycles are used (one time) to adjust the fuse words so that they do not overlap SRAM word boundaries. This aspect of the invention is similar to the previous process and begins by calculating the offset as described above. The invention then determines the physical address of the very first fuse word using process described above. The invention again reads two SRAM lines (e.g., reads a "first" SRAM line and an adjacent "second" SRAM line). The invention stores bits from the end of the first SRAM line in a first data register. This process then combines the end of the first SRAM line with the beginning of the second SRAM line to create a single fuse word and stores (overwrites) the single fuse word in an address where the first SRAM line was read from during the reading process. Before overriding the beginning part of the first SRAM line, the invention can store these initial bits (which will eventually comprise the beginning of the second SRAM line in the very last fuse word, assuming that the fuse words completely fill the SRAM array).

Figure 6:
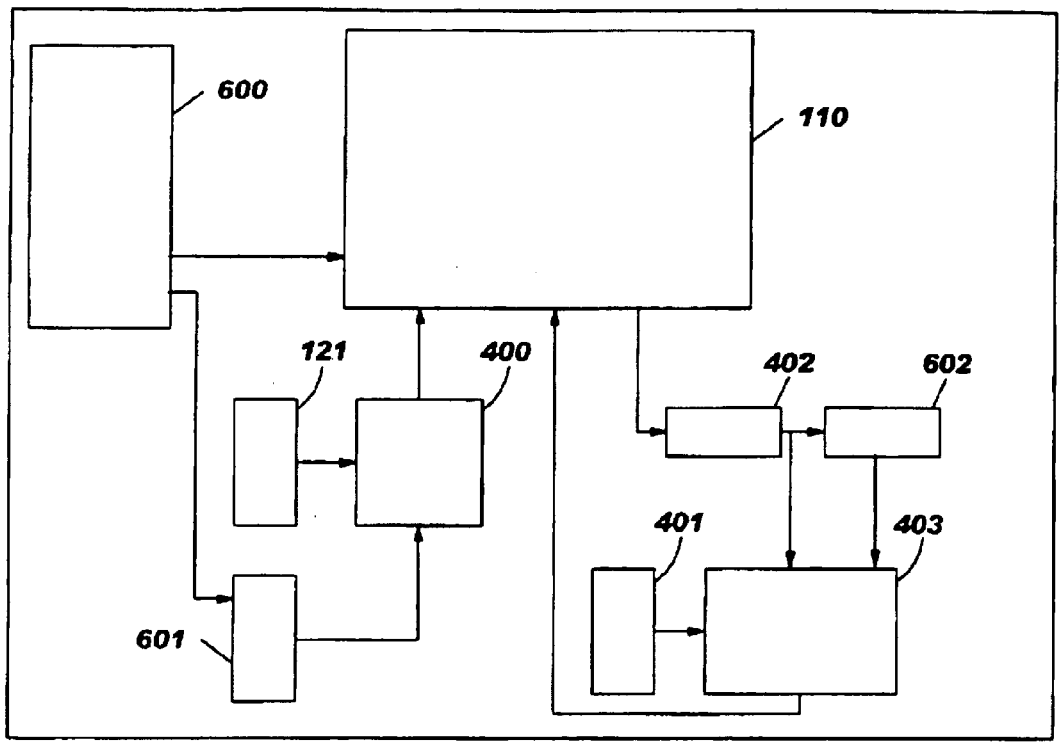
FIG. 6 is a schematic diagram of a one embodiment of the inventive embedded DRAM structure that includes fuse information within an SRAM.

This process is repeated for each subsequent line in the SRAM array, thereby insuring that each line in the SRAM array contains a single fuse word. The rearranging of the fuse words is accomplished using the structure shown in FIG. 6 that includes an 8 state finite state machine (FSM) 600. In order to avoid unnecessary data alignment, this aspect of the invention includes a fix address counter 601 that begins counting at zero and counts up to the number of fuse words, after which the alignment process stops. The number of cycles required to fix the fuse word locations (that the fix address counter 601 will count to) is approximately fixed at 3*n, with n being the number of SRAM words. The FSM 600 must perform a read operation (state 4), an aligned word construction operation (state 5), and a write operation (state 6) for each word in the SRAM, if the number of words in the SRAM is equal to the number of fuse words. This results in three operations needed to align each fuse word.

This re-alignment operation is started by a "fix" signal being pulsed active. This signal can be provided externally, or it can be generated automatically with the conclusion of fuse loading or the beginning of BIST system test. The FSM will, when finished, provide a "fix done" signal that will remain active and the FSM will remain in its stop state until the macro is reset. Normal/test operations may then commence.

Figure 7:
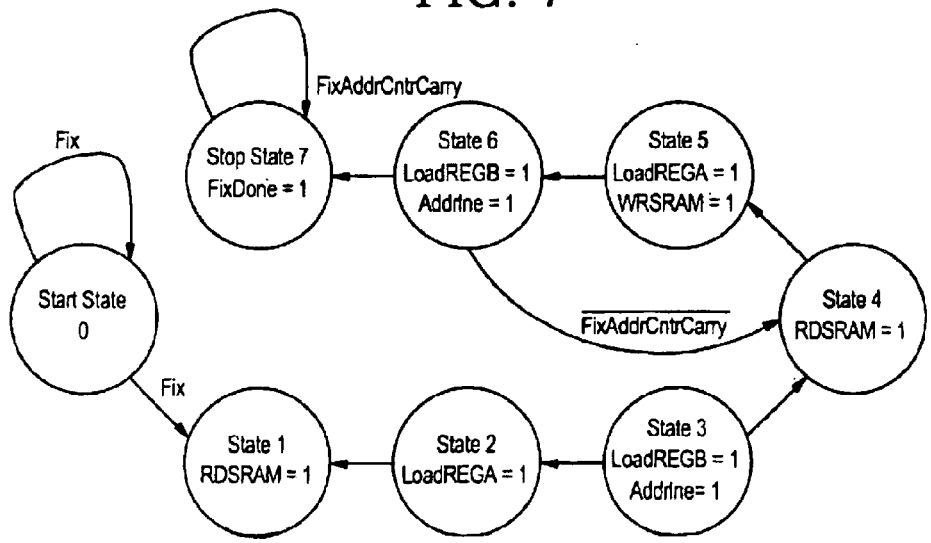
FIG. 7 is a schematic diagram of the states within the state machine shown in FIG. 6.
Figure 8:
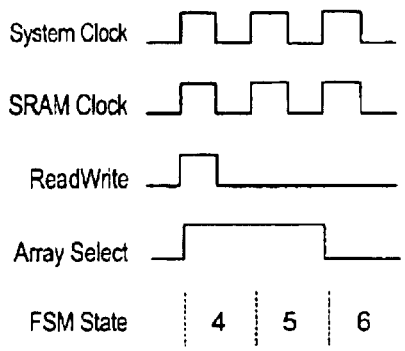
FIG. 8 is a signal timing diagram that illustrates the signals used to align the fuse information in the structure shown in FIG. 6.

As shown in the state diagram in FIG. 7, the FSM acts very similarly to the previously described process. The process begins at start (state 0) and then an address is generated and combined with the address offset contained in the original address count register (state 1). The data from this address is read to a temporary storage register A (state 2). This data is then shifted to the second temporary register B (state 3), and another read of the next SRAM word takes place (state 4), with its result stored in the first (now empty) temporary register A (state 5). The bit offset contained in the bit count register is used to produce the actual fuse word from the data in registers A and B, which is then written to the SRAM array 110 (also state 5). The data in register A is then shifted to register B (state 6), and the SRAM 110 is read again to register A (arrow flowing back to state 4). The timing signals for this process are shown in FIG. 8 where the system clock matches the SRAM clock. A read operation is performed in state 4 and the array select is active during both states 4 and 5 to allow the next SRAM line to be read and then the aligned fuse word to be written back to the SRAM. This process is repeated for every word in the SRAM 110 array until all the fuse words have been fixed to match the SRAM word boundaries (state 7).

After the fuse words have been aligned with the SRAM words, the SRAM array can then be accessed a single time for each normal read access input. The physical SRAM address is still calculated by combining the offset stored in the address count register with the normal logical input address. However, in this embodiment, the offset is adjusted so that the physical address begins at the most significant bit of the corresponding SRAM line. In the previous embodiment, the offset is divided by the number of bits within the SRAM lines and the remainder from that division process represents the bit location within the given SRAM line where the fuse word would begin. However, because this embodiment has realigned the fuse words with the SRAM word lines, this remainder is subtracted from the offset so that when the offset is added to the logical fuse word address, the physical address that is produced begins at the most significant bit of the corresponding SRAM line.

Figure 9:
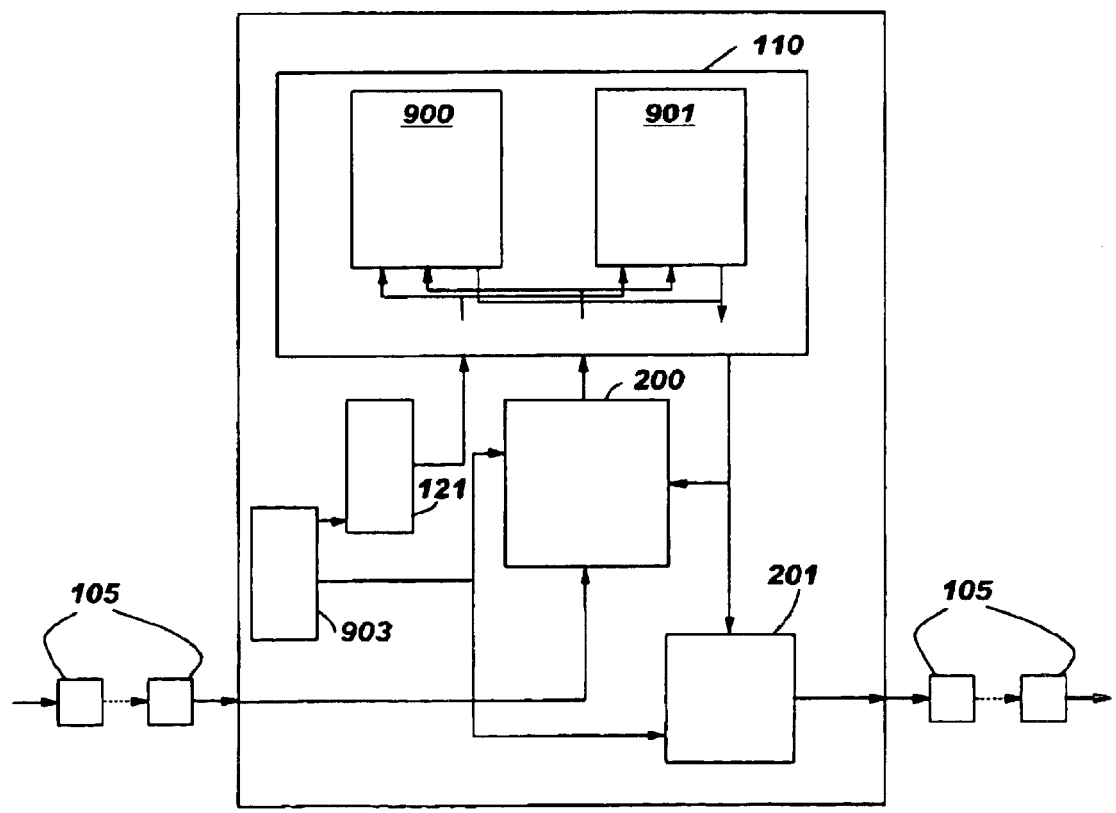
FIG. 9 is a schematic diagram of a one embodiment of the inventive embedded DRAM structure that includes fuse information within dual SRAM arrays.
Figure 11:
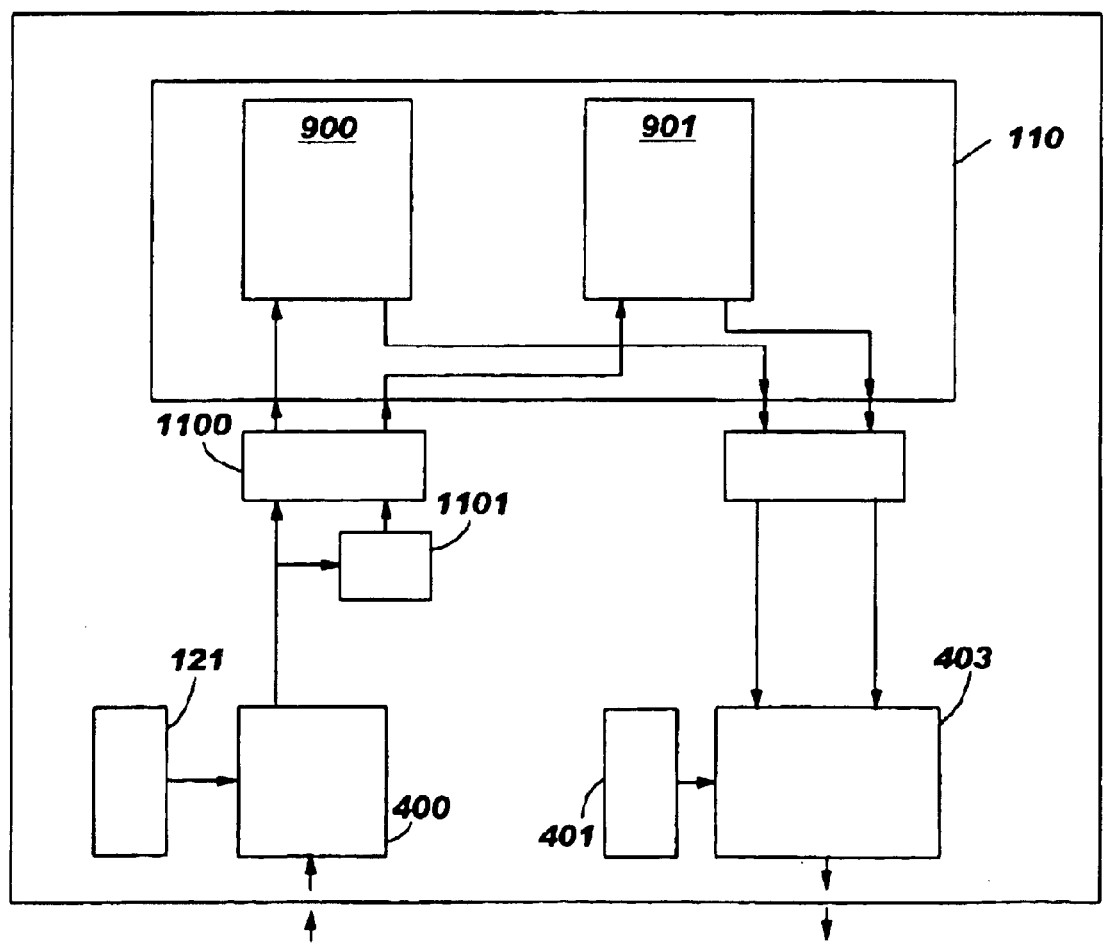
FIG. 11 is a schematic diagram of a one embodiment of the inventive embedded DRAM structure that includes fuse information within an SRAM.
Figure 12:
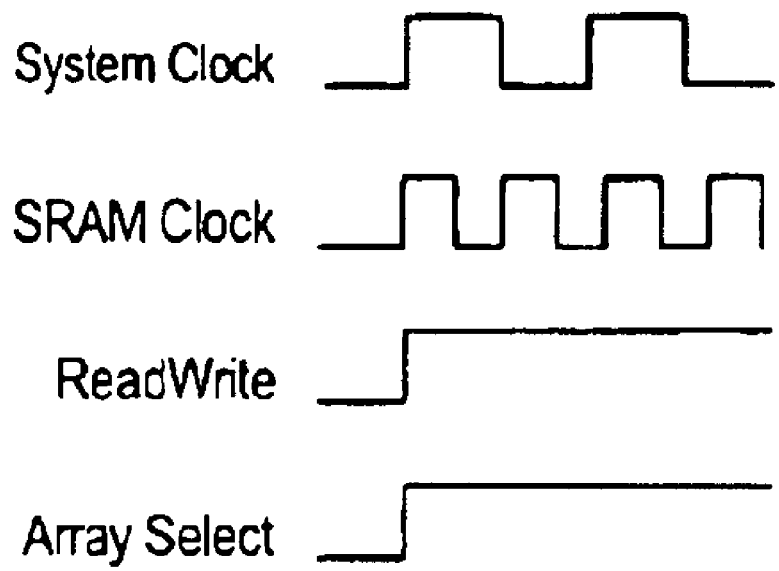
FIG. 12 is a signal timing diagram that illustrates the signals used to retrieve the fuse information in the structure shown in FIG. 11.

The invention also includes additional embodiments that utilize multiple SRAM arrays 900, 901 within each embedded DRAM structure as shown in FIGS. 9 and 11. In such embodiments, the SRAM arrays 900, 901 are connected to the upstream and downstream latches 105 that make up the scan chain. In a somewhat similar process as that described above, this aspect of the invention serially scans data into the scan chain and stores the data in the SRAM arrays 900, 901 using a first-in, first-out (FIFO) operation. This FIFO operation is somewhat different than the previously described FIFO operation in that this process first writes to a line of the first SRAM array 900 and, once the line of the first SRAM array is full, writes additional bits received to the same line of the second SRAM array 901. In other words, this embodiment treats the side-by-side lines of the adjacent SRAM arrays 900, 901 as one double-sized SRAM word line. The FIFO operation writes to a subsequent line in the first SRAM array 900 only after the previous line of the second SRAM array 902 is full.

This embodiment allows the SRAM 110 to be accessed immediately after fuse information is loaded, with only some simple logic needed to produce the physical word address of a desired logical fuse word. This embodiment eliminates the need to run the SRAM 110 on a multiplied clock (as described above), and eliminates the need to realign the fuse words with the SRAM 110 word lines.

This can use either two SRAMs or a single multi-port SRAM that allows for two simultaneous reads/writes. The use of two separate SRAMs is illustrated in the drawings; however, the invention is not limited and one ordinarily skilled in the art would understand (after reading this disclosure) that the use of a multi-port SRAM will be similar. With the multi-port SRAM, instead of reading/writing between SRAMs the method would read/write between the top half and the bottom half of the same SRAM (virtually creating two SRAMS).

Figure 10:
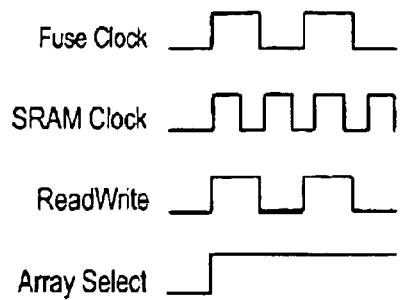
FIG. 10 is a signal timing diagram that illustrates the signals used to store the fuse information in the structure shown in FIG. 9.

Loading the SRAM arrays is very similar to the method discussed above with respect to FIG. 2. One difference with the embodiment shown in FIG. 9 is that the bit count now counts to twice the fuse word/SRAM 110 word width which requires a 2X counter 903. This effectively writes bits from the most significant bit in SRAM 900 to the least significant bit in SRAM 901 in each line of the SRAM arrays (treating the side-by-side lines as a single double-sized line). Using this process, the fuse word will be contained in a single SRAM word, or else it will be divided between words from SRAM 900 and SRAM 901. However, this embodiment eliminates the need to sequentially read lines from a single SRAM memory at twice the speed of the system clock (as in the previous embodiment) because the two adjacent SRAM lines will always be in separate SRAM arrays 900, 901 that can be read simultaneously (in parallel). Therefore, this embodiment can read the adjacent SRAM word lines that may contain the beginning and ending of partial fuse words in parallel in a single clock read cycle. The signal timing diagram in FIG. 10 illustrates the signals as data is written to the SRAM 900 and SRAM 901, and is identical to the timing diagram in FIG. 3 which illustrated loading data into a single SRAM 110. While the array select signal is active, the SRAM clock operates at twice the frequency of the fuse and read write clock, because the SRAM clock must perform a read and a write during the time when a single read is made by the scan and bit insertion logic input 200. As explained above, the SRAM (either 900 or 901) must read the old bit from the address in question so that it can be output through the scan out bit selection logic output 201 and also write the new bit in the same address in a single fuse clock read/write.

In this embodiment, the invention writes a first bit to a first bit address of the first line of the first SRAM array and then writes additional bits to additional addresses within the first line of the first SRAM array. A first counter is incremented as each additional bit is written to the first line of the first SRAM array. When the first counter reaches the maximum size of the first line (e.g., word line size) of the first SRAM array, the method repeats the incrementing and writing processes for the first line of the second SRAM array. Similarly, when the counter reaches a maximum size of the first line of the second SRAM array, the method repeats the incrementing, writing, and repeating processes for subsequent lines in both SRAM arrays.

During the above writing process, the invention simultaneously increments a second counter as each bit is written to the SRAM arrays. When the second counter reaches a maximum size of both the SRAM arrays, the method outputs the first bit in the first bit address of the first line of the first SRAM array to the downstream latches and overwrites the first bit in the first bit address in the first line of the first SRAM array with the most recently received bit. Then, the invention repeats the outputting and the overwriting for each subsequent bit in the SRAM arrays as additional bits are received (in the order in which the bits were written to the SRAM arrays) until all the fuse data is received. As with the previously described processes, this leaves both SRAM arrays with the fuse information contained in the most recently received bits within the serial bit stream.

Accessing a fuse word is simply a matter of generating a physical address for a fuse word based on the logical fuse word address (using the final value stored in the address count register as an offset). The next SRAM word is also read at the same time from the opposite SRAM 110. The actual fuse word is then constructed from these two SRAM 110 words based on the bit offset stored in the bit count register.

More specifically, the accessing process calculates the offset by maintaining an offset counter 400 that counts to the number of bits in both the SRAM arrays 900, 901 and then resets, as data is written to the SRAM. The value remaining in the offset counter at the end of writing to the SRAM represents the offset. The invention determines the physical location of a first bit within a desired fuse word request utilizing an address multiplexor 1100 and an address incrementor 1101, as shown in FIG. 11.

These devices 1100, 1101 add the logical address of the desired fuse word to the offset to produce a gross physical location. Then devices 1100, 1101 dividing the gross physical location by a divider (that is equal to twice the number of bits in the SRAM word line), to produce an integer and a remainder. The integer represents the row of the physical address and the remainder represents the column address. If the remainder is greater than the number of bits in the SRAM word line, the column address is in the second SRAM array and is equal to the remainder less the-number of bits in the SRAM word line. Thus, in this situation, the multiplexor 1100 would select the second SRAM 901. If the remainder is no greater than the number of bits in the SRAM word line, the column address is in the first SRAM array and is equal to the remainder. Therefore, in this situation, the multiplexor 1100 would select the first SRAM 900.

The invention then simultaneously reads one SRAM line from each of the SRAM arrays in a single read cycle to read a first SRAM line and a following second SRAM line. If the column address (determine above) is in the first SRAM array 900, the invention reads the first line from the first SRAM array 900 followed by reading the same first line from the second SRAM array 901. In such a situation, the line read from the first SRAM array 900 comprises the "first" SRAM line and the line read from the second SRAM array 901 comprises the "second" SRAM line. Alternatively, if the column address is in the second SRAM array 901, the invention reads the first line from the second SRAM array 901 followed by reading the second line in the first SRAM array 900 that immediately follows the first line in the first SRAM array 900. Contrary to the previous example, in this situation the first line from the second SRAM array 901 comprises the "first" SRAM line and the first line from the first SRAM array 900 comprises the "second" SRAM line.

Using the data multiplexor 1102, the invention combines the end of the "first" SRAM line with the beginning of the "second" SRAM line to output a single fuse word to the data mapping logic 403. The end of the first SRAM line comprises bits of the first SRAM line from the physical location to the least significant bit of the first SRAM line and the beginning of the second SRAM line comprises bits of the second SRAM line from the most significant bit of the second SRAM line up to one significant bit position less than the significant bit position of the physical location in the first SRAM line.

The signal timing paragraph and FIG. 11 shows the signals as the read operation is performed. The signals are similar to those shown in FIG. 10, however, the read/write signal is maintained in an active position throughout the process as the invention continually reads during the operation. The remaining signals act in a similar manner as discussed above with respect to FIG. 10.

The invention enables the conversion of non-scannable memory elements which previously could only be loaded in parallel into scannable memory elements that can be loaded in a serial fashion. This conversion is of great use in implementing higher speed, denser, memories that are still loadable through a scan chain. Fuse information storage local to an embedded memory structure is one use for this invention. The invention can improve fuse information storage not only in embedded DRAM memories, but also in embedded SRAM, CAM and other memory types. Another important use for this invention is for converting small read only memories, that can be initialized via scan, from discrete scannable elements into faster and denser SRAM. These scannable read only memories (SROMs) are typically used for storing BIST micro-code instructions, and overall BIST performance can be greatly improved through the conversion of the SROM to a scannable SRAM.

While the invention has been described in terms of preferred embodiments, those skilled in the art will recognize that the invention can be practiced with modification within the spirit and scope of the appended claims.

What is claimed is:

1. A method of serially storing and retrieving fuse information to and from a static random access memory (SRAM) array within an embedded dynamic random access memory (DRAM) structure, wherein said SRAM array is connected to upstream and downstream latches that make up a scan chain, said method comprising:

serially scanning data into said scan chain;

counting the number of bits scanned into said embedded DRAM structure using a counter;

loading said fuse information into a shift register after said counter counts to an amount equal to the number of bits of storage of all downstream scan latches in said scan chain;

loading contents of said shift register to a SRAM line of said SRAM array when said shift register is full;

repeating said processes of loading said shift register and loading said SRAM array until said SRAM array is full; and reading said fuse information from said SRAM array by specifying an address in said SRAM array.

2. The method in claim 1, wherein the number of bits in said shift register and said SRAM line are equal to the number of bits in a fuse word.

3. The method in claim 1, wherein data is written to said SRAM array in parallel operations.

4. The method in claim 1, wherein said downstream scan latches are downstream from said embedded DRAM structure.

5. The method in claim 1, wherein said process of loading said contents of said shift register to said SRAM line comprises counting, in a second counter, bits loaded into said shift register and, once the value in said second counter is equal to the size of said SRAM line, all of said bits from said shift register are simultaneously loaded into said SRAM line in parallel.

6. A method of serially storing fuse information in a static random access memory (SRAM) array within an embedded dynamic random access memory (DRAM) structure, wherein said SRAM array is connected to upstream and downstream latches that make up a scan chain, said method comprising:
 serially scanning data into said scan chain; and
 storing said data in said SRAM array using a first-in, first-out (FIFO) operation until no more data is scanned into said scan chain.

7. The method in claim 6, wherein said FIFO operation comprises incrementing an address counter as each bit of data is scanned into said SRAM array, such that each bit of data received is written to a subsequent bit within said SRAM array.

8. The method in claim 6, wherein said FIFO operation comprises:
 writing a first bit to a first bit address of said SRAM array;
 writing additional bits to additional addresses of said SRAM array;
 incrementing a counter as each additional bit is written to said SRAM array;
 wherein, when said counter reaches a maximum size of said SRAM array, said method comprises:
 outputting said first bit to said downstream latches;
 overwriting said fist bit with a most recently received bit; and
 repeating said outputting and said overwriting for each subsequent bit in said SRAM array as additional bits are received.

9. The method in claim 8, wherein after writing processes is completed, said SRAM array contains only the most recently received bits.

10. A method of retrieving fuse information from a static random access memory (SRAM) array within an embedded dynamic random access memory (DRAM) structure, wherein said SRAM array is connected to upstream and downstream latches that make up a scan chain, wherein the length of SRAM lines in said SRAM array are equal to a fuse word, and wherein fuse words stored in said SRAM array may bridge two SRAM lines, said method comprising:
 calculating an offset;
 determining the physical location of a first bit within a desired fuse word request by adding the logical address of said first bit of said desired fuse word to said offset;
 reading two SRAM lines to read a first SRAM line containing said physical location of said first bit and a second SRAM line immediately following said fist SRAM line; and
 combining the end of said first SRAM line with the beginning of said second SRAM line to output said desired fuse word.

11. The method in claim 10, wherein said calculating of said offset comprises maintaining an offset counter that counts to the number of bits in said SRAM array and then resets as data is written to said SRAM array, wherein a value remaining in said offset counter at the end of writing to said SRAM array represents said offset.

12. The method in claim 10, wherein said end of said first SRAM line comprises bits of said first SRAM line from said physical location to the least significant bit of said first SRAM line, and wherein said beginning of said second SRAM line comprises bits of said second SRAM line from a most significant bit of said second SRAM line up to one significant bit position less than the significant bit position of said physical location in said first SRAM line.

13. The method in claim 10, wherein said reading of said two SRAM lines is performed in a single system clock cycle.

14. The method in claim 10, wherein said combining process outputs a single fuse word.

15. A method of realigning fuse information in a static random access memory (SRAM) array within an embedded dynamic random access memory (DRAM) structure, wherein said SRAM array is connected to upstream and downstream latches that make up a scan chain, wherein the length of SRAM lines in said SRAM array are equal to a fuse word, and wherein fuse words stored in said SRAM array may bridge two SRAM lines, said method comprising:
 calculating an offset;
 determining the physical location of a first bit in a first fuse word by adding the logical address of said first bit in said first fuse word to said offset;
 reading two SRAM lines to read a first SRAM line containing said physical location and a second SRAM line immediately following said first SRAM line;
 storing bits from the end of said first SRAM line in a first data register;
 storing bits from the beginning of said second SRAM line in a second data register;
 combining said end of said first SRAM line with said beginning of said second SRAM line to create a single fuse word;
 storing said single fuse word in said first SRAM line to overwrite said first SRAM line with said fuse word; and
 repeating processing from said determining process to said process of storing said single fuse word for all remaining fuse words.

16. The method in claim 15, wherein said calculating of said offset comprises maintaining an offset counter that counts to the number of bits in said SRAM array and then resets as data is written to said SRAM array, wherein a value remaining in said offset counter at the end of writing to said SRAM array represents said offset.

17. The method in claim 15, wherein said end of said first SRAM line comprises bits of said first SRAM line from said physical location to the least significant bit of said first SRAM line and wherein said beginning of said second SRAM line comprises bits of said second SRAM line from the most significant bit of said second SRAM line up to one significant bit position less than the significant bit position of said physical location in said first SRAM line.

18. The method in claim 15, wherein said first fuse word comprises the first logical fuse word of fuse words stored in said SRAM array.

19. The method in claim 15, wherein after said repeating process is completed, all fuse words are aligned with SRAM array words.

20. A method of serially storing fuse information to multiple static random access memory (SRAM) arrays within an embedded dynamic random access memory (DRAM) structure, wherein said SRAM arrays are connected to upstream and downstream latches that make up a scan chain, said method comprising:

serially scanning data into said scan chain; and storing said data in said SRAM arrays using a first-in, first-out (FIFO) operation, wherein said FIFO operation first writes to a first line of a first SRAM array and, once said first line of said first SRAM array is full, writes additional bits received to the same first line of a second SRAM array, and wherein said FIFO operation writes to a subsequent line in said first SRAM array that follows said first line only after said first line of said second SRAM array is full.

21. The method in claim 20, wherein said FIFO operation comprises incrementing an address counter as each bit of data is scanned into said SRAM arrays, such that each bit of data received is written to a subsequent bit within said SRAM arrays.

22. The method in claim 20, wherein said FIFO operation comprises:

writing a first bit to a first bit address of said first line of said first SRAM array;

writing additional bits to additional addresses within said first line of said first SRAM array;

incrementing a first counter as each additional bit is written to said first line of said first SRAM array;

wherein, when said first counter reaches a maximum size of said first line of said first SRAM array, said method repeats said incrementing and writing processes for said first line of said second SRAM array;

wherein, when said counter reaches a maximum size of said first line of said second SRAM array, said method repeats said incrementing, writing and repeating processes for subsequent lines in both said SRAM arrays.

23. The method in claim 22, wherein said method further comprises:

incrementing a second counter as each bit is written to said SRAM arrays, wherein when said second counter reaches a maximum size of both said SRAM arrays, said method comprises:

outputting said first bit in said first bit address of said first line of said first SRAM array to said downstream latches;

overwriting said first bit in said first bit address in said first line of said first SRAM array with a most recently received bit; and repeating said outputting and said overwriting for each subsequent bit in said SRAM arrays as additional bits are received in the order in which said bits were written to said SRAM arrays.

24. The method in claim 23, wherein after writing processes is completed, said SRAM arrays contain only the most recently received bits.

25. A method of retrieving fuse information from multiple static random access memory (SRAM) arrays within an embedded dynamic random access memory (DRAM) structure, wherein said SRAM arrays are connected to upstream and downstream latches that make up a scan chain, and wherein the length of SRAM lines in said SRAM arrays are equal to a fuse word, and wherein fuse words stored in said SRAM may bridge two SRAM lines in different SRAM arrays, said method comprising:

calculating an offset;

determining the physical location of a first bit within a desired fuse word request using said offset;

reading one SRAM line from each of said SRAM arrays in a single read cycle to read a first SRAM line and a following second SRAM line within said single read cycle, and combining the end of said first SRAM line with the beginning of said second SRAM line to output a single first word, wherein said end of said first SRAM line comprises bits of said first SRAM line from said physical location to the least significant bit of the first SRAM line, and wherein said beginning of said second SRAM line comprises bits of said second SRAM line from a most significant bit of said second SRAM line up to one significant bit position less than the significant bit position of said physical location in said first SRAM line.

26. The method in claim 25, wherein said calculating of said offset comprises maintain an offset counter that counts to the number of bits in both said SRAM arrays and then resets, as data is written to said SRAM, wherein a value remaining in said offset counter at the end of writing to said SRAM represents said offset.

27. The method in claim 25, wherein said process of determining the physical location of a first bit within a desired fuse word request comprises:

adding the logical address of said desired fuse word to said offset to produce a gross physical location; and dividing said gross physical location by a divider that is twice the number of bits in a line in one of said SRAM arrays to produce an integer and a remainder, wherein said integer represents the row of said physical address and said remainder represents a column address, wherein if said remainder is greater than said number of bits in said line of one of said SRAM arrays, said column address is in said second SRAM array and is equal to said remainder less said number of bits in said line in one of said SRAM arrays, and wherein if said remainder is no greater than said number of bits in said line in one of said SRAM arrays, said column address is in said first SRAM array and is equal to said remainder.

28. The method in claim 27, wherein said reading process comprises one of:

if said column address is in said first SRAM array, reading a first line from a first SRAM array followed by reading the same first line from a second SRAM array, such that said first line from said first SRAM array comprises said first SRAM line and said first line from said second SRAM array comprises said second SRAM line; and if said column address is in said second SRAM array, reading said first line from said second SRAM array followed by reading a second line in said first SRAM array that immediately follows said first line and sad first SRAM array such that said first line from said second SRAM array comprises said first SRAM line and said first line from said first SRAM array comprises said second SRAM line.

29. The method in claim 25, wherein said SRAM arrays comprise a single multi-port SRAM.

30. A program storage device readable by machine, tangibly embodying a program of instructions executable by the machine to perform a method of realigning fuse information in a static random access memory (SRAM) array within an embedded dynamic random access memory DRAM) structure, wherein said SRAM array is connected to upstream and downstream latches that make up a scan chain, wherein the length of SRAM lines in said SRAM array are equal to a fuse word, and wherein fuse words stored in said SRAM array may bridge two SRAM lines, said method comprising:

calculating an offset;

determining the physical location of a first bit in a first fuse word by adding the logical address of said first bit in said first fuse word to said offset;

reading two SRAM lines to read a first SRAM line containing said physical location and a second SRAM line immediately following said first SRAM line;

storing bits from the end of said first SRAM line in a first data register;

storing bits from the beginning of said second SRAM line in a second data register;

combining said end of said first SRAM line with said beginning of said second SRAM line to create a single fuse word;

storing said single fuse word in said first SRAM line to overwrite said first SRAM line with said fuse word; and repeating processing from said determining process to said process of storing said single fuse word for all remaining fuse words.

31. The program storage device in claim 30, wherein said calculating of said offset comprises maintaining an offset counter that counts to the number of bits in said SRAM array and then resets as data is written to said SRAM array, wherein a value remaining in said offset counter at the end of writing to said SRAM array represents said offset.

32. The program storage device in claim 30, wherein said end of said first SRAM line comprises bits of said first SRAM line from said physical location to the least significant bit of said first SRAM line and wherein said beginning of said second SRAM line comprises bits of said second SRAM line from the most significant bit of said second SRAM line up to one significant bit position less than the significant bit position of said physical location in said first SRAM line.

33. The program storage device in claim 30, wherein said first fuse word comprises the first logical fuse word of fuse words stored in said SRAM array.

34. The program storage device in claim 30, wherein after said repeating process is completed, all fuse words are aligned with SRAM array words.

* * * * *